United States Patent [19]

Takeda et al.

[11] Patent Number: 5,473,409
[45] Date of Patent: Dec. 5, 1995

[54] SEMICONDUCTOR LIGHT EXPOSURE DEVICE

[75] Inventors: Minoru Takeda; Shigeo Kubota; Michio Oka; Tohru Ogawa, all of Kanagawa, Japan

[73] Assignee: Sony Corporation, Tokyo, Japan

[21] Appl. No.: 309,874

[22] Filed: Sep. 20, 1994

[30] Foreign Application Priority Data

| Sep. 21, 1993 | [JP] | Japan | 5-234720 |
| Sep. 21, 1993 | [JP] | Japan | 5-234721 |
| Nov. 15, 1993 | [JP] | Japan | 5-308742 |

[51] Int. Cl.⁶ ............................................. G03B 27/42
[52] U.S. Cl. .................................. 355/53; 355/67
[58] Field of Search ............................ 355/53, 67, 71

[56] References Cited

U.S. PATENT DOCUMENTS

| 4,811,055 | 3/1989 | Hirose | 355/53 |
| 4,905,041 | 2/1990 | Aketagawa | 355/53 |
| 4,937,619 | 6/1990 | Fukuda et al. | 355/53 |

Primary Examiner—Richard A. Wintercorn
Attorney, Agent, or Firm—Hill, Steadman & Simpson

[57] ABSTRACT

An exposure device in which a reticle having a circuit pattern of a semiconductor device formed on it is irradiated with light beam emanated from a light source, such as a laser light source, for exposing the circuit pattern formed on the reticle on a semiconductor wafer. The exposure device includes a light beam generator for illuminating the reticle having a semiconductor circuit pattern formed on it, an image-forming optical system for forming an image on a wafer of a light image produced on radiating a light beam on the reticle from the light beam generator. The exposure device also includes a movement unit for moving the wafer relative to the image-forming optical system, and an alignment unit for detecting the position on the wafer of the image formed on the wafer by the image-forming optical system for position matching the image by the image-forming optical system relative to the wafer. The light beam generator includes a light source for excitation, a first resonator and a second resonator. The first resonator is illuminated by the light beam from the light source for excitation and outputs the light beam from the light source for excitation after waveform conversion. The second resonator is illuminated by the light beam from the first resonator and outputs the light beam from the first resonator after waveform conversion.

24 Claims, 12 Drawing Sheets

SEMICONDUCTOR LIGHT EXPOSURE DEVICE

BACKGROUND OF THE INVENTION

1. Field of the Invention

This invention relates to an exposure device in which a reticle having a circuit pattern of a semiconductor device formed thereon is irradiated with a light beam emanated from a light source, such as a laser light source, for exposing the circuit pattern formed on the reticle on a semiconductor wafer.

2. Description of the Related Art

In a conventional semiconductor light exposure device, a light source of a projecting optical system o a short wavelength is employed for increasing the integration degree of a semiconductor integrated circuit. Among such light sources of the projecting optical system, there are a ultra-high pressure mercury arc lamp or an eximer laser. With the ultra-high pressure mercury arc lamp, the wavelength of the radiated light is 435.8 nm, 404.7 nm and 365 nm for the g ray, h ray and the i ray, respectively. However, the circuit pattern of fine linewidths on the order of 25 µm as required of recent semiconductor integrated circuits cannot be produced even with the use of the shortest wavelength i ray. For successfully coping with the fine linewidths in the semiconductor integrated circuit, it is necessary to reduce the wavelength of the light radiated from the light source of the projecting optical system further.

In order to render it possible to form circuit patterns of finer linewidths, there has been proposed a semiconductor light exposure method known as a phase shifting method employing the ultra resolution technique. With the phase shifting method, the light transmitted through a main pattern on a reticle carrying a circuit pattern is superposed on the light transmitted through a peripheral pattern having a phase difference of 180° thereto by interference for attenuating the component of the 0th order diffraction not contributing to imaging and emphasizing the 1st order diffraction necessary for pattern formation in order to improve the resolution. However, even with the semiconductor light exposure device employing the phase shifting method, it is extremely difficult to form a fine circuit pattern on the order of 0.25 µm required of the highly integrated semiconductor integrated circuit.

In order to render it possible to form a fine circuit pattern of the semiconductor device, there has also been proposed a semiconductor light exposure device employing an eximer laser radiating the light of an extremely short wavelength as a light source. The eximer laser radiates a laser light by electrical discharge in a gas mixture of a rare gas and a halogen-based gas. The eximer laser radiates a laser light of an extremely short wavelength, such as 248 nm or 193 nm for the gas mixture of KrF or ArF, respectively. By employing the eximer laser as a light source of the projecting optical system, it becomes possible to achieve light exposure of a finer circuit pattern.

Since the eximer laser generates a light beam of a broader wavelength width, the semiconductor light exposure device employing the eximer laser suffers from a drawback that chromatic aberration of the projecting optical system projecting a circuit pattern formed on the reticle on a semiconductor wafer tends to be increased. For suppressing generation of chromatic aberration, the broad wavelength width of the light beam radiated from the eximer laser is decreased using a filter. By causing the light beam of the decreased wavelength width to be incident on the imaging optical system, it becomes possible to project an image of the circuit pattern on the semiconductor wafer with suppressed chromatic aberration. However, if the wavelength width of the light beam generated by the eximer laser is decreased in this manner, the ratio of the light energy employed for light exposure to the energy of the light beam generated by the eximer laser is decreased, thus lowering the energy efficiency of the semiconductor light exposure device.

On the other hand, since the eximer laser generates the light beam by pulse oscillation, it is difficult to control the volume of light radiated on the semiconductor wafer on which the circuit pattern is exposed. In addition, since the eximer laser is nonuniform in the oscillation mode of the light beam, the linewidth of the circuit pattern exposed on the semiconductor wafer is not constant.

Since the semiconductor light exposure device is designed to form an extremely fine pattern on a semiconductor wafer by light exposure, it is employed in a dust-free clean room environment. Such clean room is expensive in construction cost per unit area and in maintenance cost. The eximer laser employed for the semiconductor light exposure device is a large-sized device having an installment area on the order of 1.6 m×1,2 m and hence occupies a considerable space within the clean room. In addition, it is necessary for the eximer laser to exchange the gas mixture of the rare gas and the halogen-based gas employed for light beam oscillation every three days. The gas mixture is harmful to man and difficulties are met in the exchange operations.

Thus the use of the eximer laser as a light source leads to an increased size of the semiconductor light exposure device and of the clean room in which the device is installed, thus increasing the cost. The gas mixture employed needs to be exchanged, thus rendering the control of the device difficult and increasing the cost.

OBJECTS OF THE INVENTION

It is an object of the present invention to provide a semiconductor light exposure device which renders it possible to effect light exposure of a fine circuit pattern of a highly integrated semiconductor device with high accuracy.

It is another object of the present invention to provide a semiconductor light exposure device which renders it possible to project a circuit pattern formed on the reticle on the semiconductor wafer accurately without producing chromatic aberration in the image of the circuit pattern projected from the imaging optical system.

It is a further object of the present invention to provide a semiconductor light exposure device in which alignment between the circuit pattern of the reticle and the circuit pattern exposed on the semiconductor wafer may be achieved accurately and reliably.

It s a further object of the present invention to provide a semiconductor light exposure device in which light exposure control of the circuit pattern projected on the semiconductor wafer may be achieved easily.

It is yet another object of the present invention to provide a semiconductor light exposure device which may be reduced in size and managed and handled easily.

Other objects and advantages of the present invention will become clear from the following description.

SUMMARY OF THE INVENTION

The semiconductor exposure device of the present invention includes a light beam generator for illuminating a reticle having a semiconductor circuit pattern formed thereon, an image-forming optical system for forming an image on a wafer of a light image produced on radiating a light beam on the reticle from the light beam generator, a movement unit for moving the wafer relative to the image-forming optical system, and an alignment unit for detecting the position on the wafer of the image formed on the wafer by the image-forming optical system for position matching the image by the image-forming optical system relative to the wafer. The light beam generator includes a light source for excitation, a first resonator and a second resonator. The first resonator is illuminated by the light beam from the light source for excitation and outputs the light beam from the light source for excitation after waveform conversion. The second resonator is illuminated by the light beam from the first resonator and outputs the light beam from the first resonator after waveform conversion.

The alignment unit of the semiconductor exposure device includes a detection optical system for radiating a beam at an offset position from the optical axis of a light beam radiated on the wafer from the light source means by the image-forming optical system for detecting the position of the image formed on the wafer by the image-forming optical system with respect to the wafer. Specifically, the alignment unit includes a first photodetector for detecting a 0th order diffracted light of the return light from the wafer of the light beam outputted by the first resonator of the light beam generating means, and a second photodetector for detecting the first order diffracted light of the return light from the wafer of the light beam radiated by the first resonator. The alignment means calculates the positional deviation relative to the wafer of the image formed on the wafer by the image-forming optical system based on detection signals of the first and second photodetectors and transmits the results of calculation to the movement means in order to effect position matching of the image by the image-forming optical system with respect to the wafer.

The first resonator of the light beam generating unit includes a laser medium illuminated by a light beam radiated from the excitation light source and a first non-linear optical crystal device illuminated by a light beam from the laser medium. The second resonator comprises a second non-linear optical crystal device illuminated by a light beam radiated by the first resonator, a pair of reflective surfaces on either sides of the second non-linear optical crystal device, and control means for causing one of the reflective surfaces to be moved along the optical axis of the light beam radiated by the second resonator for controlling the length of the second resonator.

The semiconductor exposure device of the present invention includes a combining optical system for combining light beams from a plurality of said light beam generating means and radiating a combined light beam on the reticle.

The first resonator of the light beam generating unit includes a first resonator illuminated by a light beam form the light source for excitation for outputting a first light beam after wavelength conversion, and a second resonator illuminated by a light beam form the first resonator for outputting a second light beam after wavelength conversion. The second light beam outputted by the second resonator is used for illuminating the reticle. The light image produced by illuminating the reticle is formed on the wafer via the image-forming optical system. The first light beam is used for position matching the image formed on the wafer by the image-forming optical system with respect to the wafer.

DETAILED DESCRIPTION OF THE PREFERRED EMBODIMENTS

The semiconductor light exposure device according to the present invention, employing the technique of photolithography, transmits an exposure light from a light source carrying a pattern of an original picture provided on a reticle enlarged to a fivefold size via an illuminating optical system to a contraction projection optical system and contracted to one-fifth size by a contracting lens of the contraction projection optical system for exposure on a resist coated on a wafer.

Figure 1:
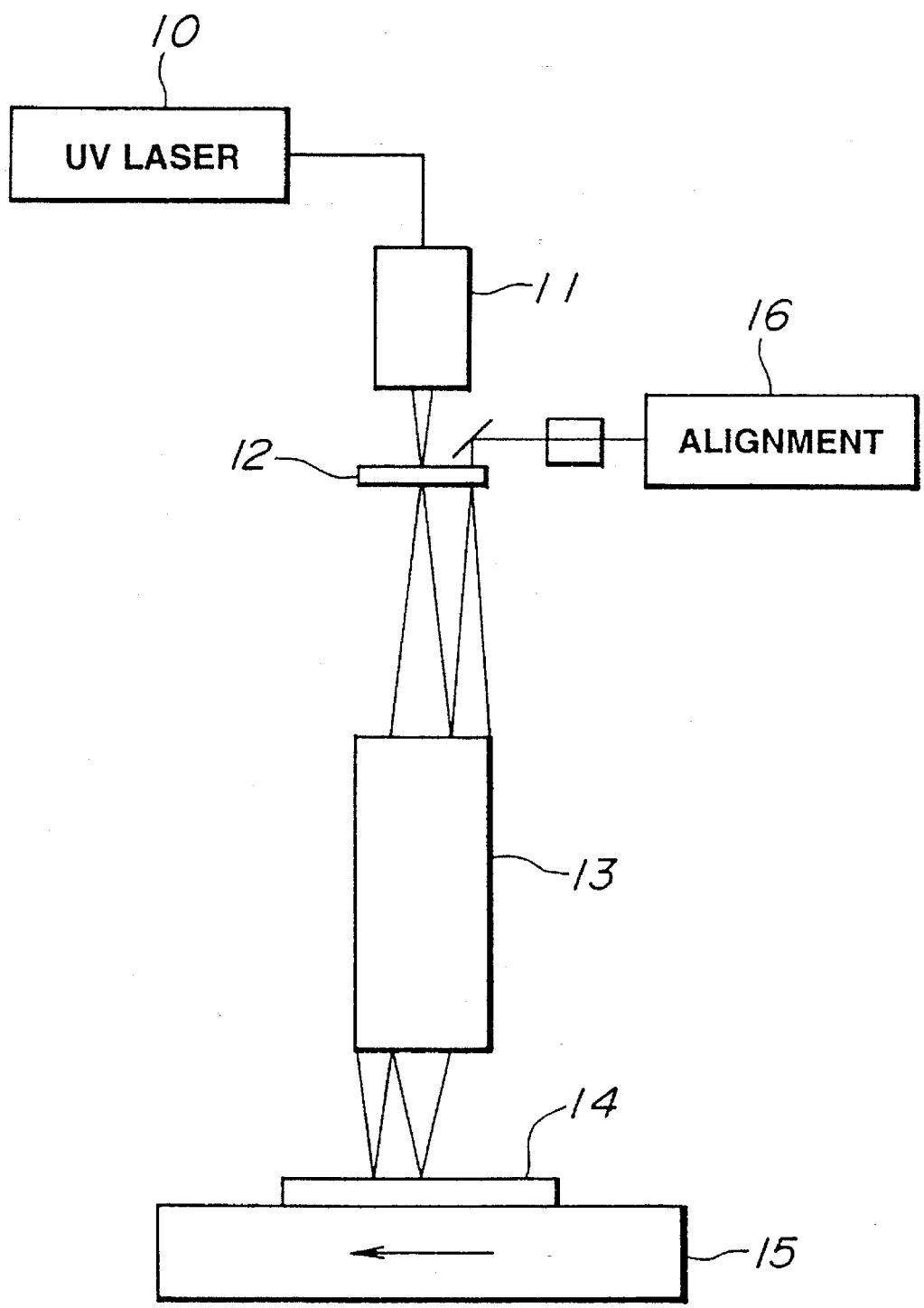
FIG. 1 is a block diagram showing a first embodiment of a semiconductor light exposure device according to the present invention.

FIG. 1 shows a first embodiment of the semiconductor exposure device according to the present invention. The present semiconductor exposure device includes an ultraviolet laser light radiating unit 10 in which a laser light emitted by diode laser excitation is wavelength-converted within a first resonator and the light wavelength-converted in an external resonation type second resonator from an outgoing light from the first resonator illuminates a reticle 12 via an illuminating optical system 11, and a contraction projection lens 13 for forming an illuminated light image produced on irradiating the reticle 12 from the radiating unit 10 on a wafer 14. The exposure device also includes an XY stage 15 for moving the wafer 14 and an alignment unit 16 for detecting the position of the image by the contraction projection lens 13 with respect to the wafer 14 and for effecting position matching.

The ultraviolet laser light radiating unit 10 introduces the light outgoing from a laser diode (enclosed semiconductor laser) into the laser medium in the first resonator for exciting the laser medium to create a laser beam having a wavelength of the fourth harmonics with respect to the wavelength of the laser beam originally generated by the semiconductor laser. The detailed construction of the ultraviolet laser light radiating unit 10 will be explained subsequently. The outgoing light having the wavelength of the fourth harmonics continuously oscillates a 266 nm wavelength laser light of a narrow width and exhibits high oscillation mode uniformity.

The laser light radiated by the ultraviolet laser light radiating unit 10 is highly coherent and hence susceptible to noise, such as speckle noise. The light source for exposure is radiated on the reticle 12 via the illuminating optical system 11. The illuminating optical system 11 reduces the coherence of the light source by employing a rotary diffusion plate or a ground glass.

The pattern on the reticle 12 is the original picture pattern enlarged to a five-fold size, as mentioned above. The light transmitted through the reticle 12 is exposed and radiated via the contraction projection lens 13 on a resist coated on the wafer 14. The contraction projection lens 13 transits the image of the incident light to project an optical image contracted to a one-fifth the size of the pattern on the wafer 14 to form a fine pattern.

There is provided a mark on the wafer 14 for correctly transcribing the original picture pattern drawn on the reticle 12 at a correct position on the wafer. The alignment unit 16 radiates a He—Ne laser on the wafer 14 and the return light from the wafer 14 is employed in an ITV camera for detecting the mark position by way of performing position control depending on the position matching between the reticle 12 and the wafer 14. The alignment unit 16 effects positioning for alignment even when the XY stage 15 is sequentially moved for effecting repeated exposure. The semiconductor exposure device transcribes the original picture pattern correctly on the entire wafer surface.

With the above arrangement, exposure with a uniform mode may be achieved without employing the phase shifting method in a manner free of chromatic aberration and in a manner of permitting facilitated control of the light exposure volume.

The basic principle and construction and the concrete construction of the ultraviolet laser light radiating unit 10 of the semiconductor exposure device of the present invention will be explained with reference to FIGS. 2 and 3 and with reference to FIG. 4, respectively.

Figure 2:
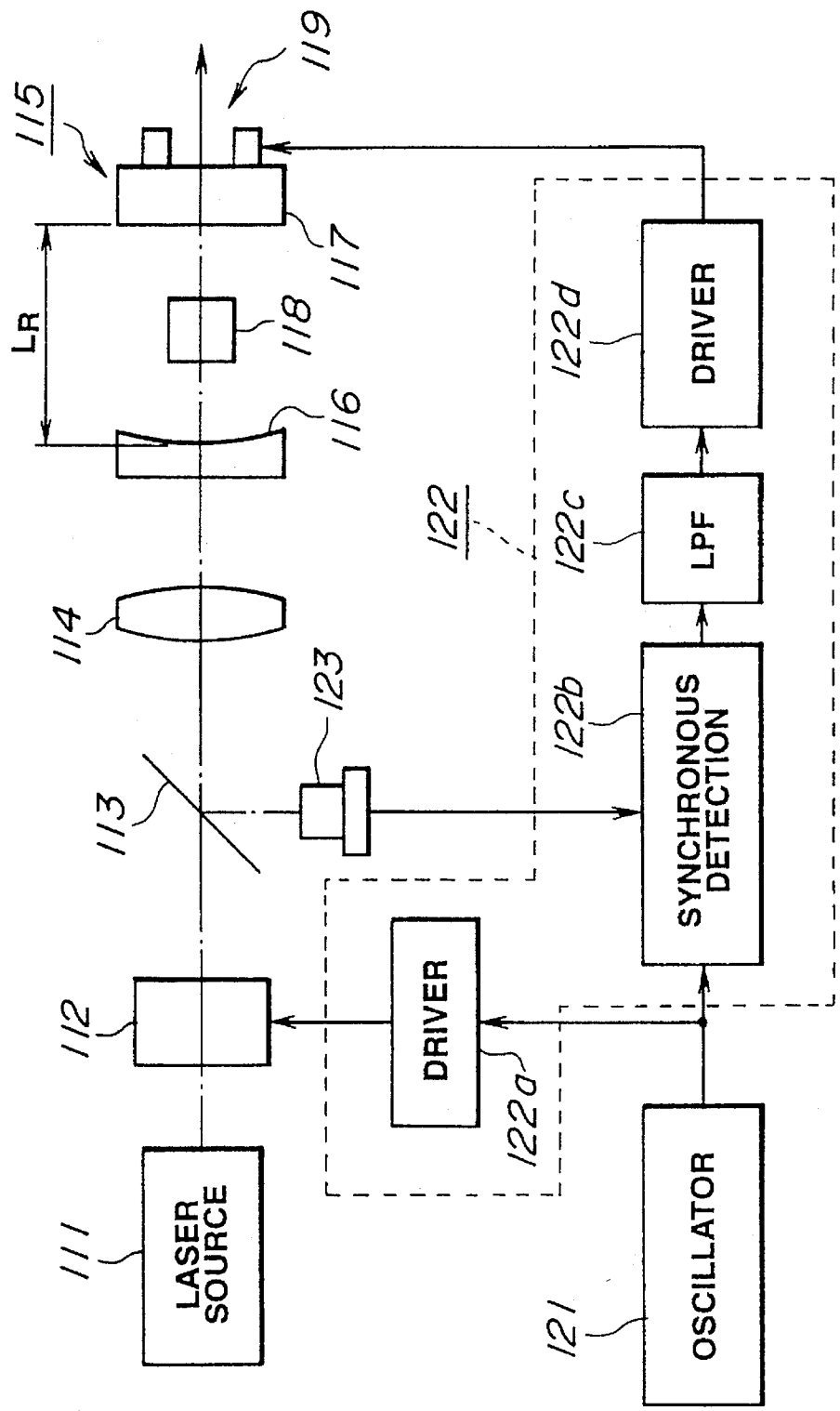
FIG. 2 is a block diagram for illustrating the basic principle of generating an ultraviolet laser employed in the device shown in FIG. 1.

A laser light source 111 shown in FIG. 2 is constituted by a second harmonics generating laser light source (SHG laser light source) as later explained, and radiates the basic wave laser light. The basic wave laser light is phase-modulated by a phase modulator 112 employing an electro-optical (EO) device or an audio-optical (AO) device so as to be incident on an external resonator 115 via a reflecting surface 113 for detecting the light reflected by the resonator and a light-collecting lens 114. The external resonator 115 is comprised of a non-linear optical crystal device 118 arranged between a reflective surface 116 of a concave mirror 116 and a reflective mirror of a plane mirror 117. The external oscillator 115 excited into resonant oscillation when the optical path length L between the reflective surfaces 116, 117 of the resonator 115 and the phase difference of the optical path Δ becomes an integer number multiple of 2π, with the reflectance and the phase of reflection being acutely changed in the vicinity of the phase of resonant oscillation. At least one of the reflective surfaces of the resonator 115, for example, the reflective surface 117, is driven along the optical axis by an electro-magnetic actuator 119.

If the SHG laser light source device is employed as the laser light source 111, and the single mode laser beam is generated and introduced to the external resonator 115, barium borate (BBO), for example, is used for a non-linear optical crystal device 118 within the resonator 115, and the laser beam which represents second harmonics with respect to the incident light is generated under the non-linear optical effects of BBO. The laser beam represents fourth harmonics if the incident light is the SHG laser. The reflective surface 116 of the concave mirror of the external resonator 115 reflects substantially all of the incident light, while the reflective surface 117 of the plane mirror is a dichroic mirror reflecting substantially all of the incident light and transmitting substantially all of the outgoing light reduced in wavelength to one-half of the wavelength of the incident light.

An oscillator 121 outputs a modulated signal for driving the optical phase modulator 112. The modulated signal is routed via a driver (driving circuit) 122a to he phase modulator 112. The reflected light (return light) of the laser light supplied to the resonator 115 is detected via the reflective surface 113 by a photodetector 123, such as a photodiode, a detection signal of which is supplied to a synchronous detector 122b, to which the modulated signal from the oscillator 121 is also supplied after wave-shaping and phase-delay as the occasions may require. The modulated signal is multiplied by the detection signal of the reflected light for performing synchronous detection. An output detection signal from the synchronous detection circuit 122b is passed through a low-pass filter (LPF) 122c so as to become an error signal for the optical path length of the resonator. This error signal is routed to a driver 122d, a driving signal of which drives the actuator 119 for shifting the reflective surface 117 along the optical axis by way of performing a servo control operation of reducing the error signal to zero, thereby controlling the optical path length $L_R$ of the external resonator 115 to a length corresponding to the locally minimum point of reflectance (resonant point).

The electro-magnetic actuator 119 may be designed as a voice coil driven type actuator, with which the duplex resonant frequency may be adjusted to tens of Khz to one hundred Khz or higher. By such increase in the resonant frequency and decrease in phase differences, the cut-off frequency of the servo range may be enlarged and the driving current may be reduced to simplify the circuit construction. Thus a system in which changes in the resonator length $L_R$ of the external resonator 115 may be stably suppressed to 1/1000 to 1/10000 of the wavelength, that is to less than 1 Å, may be constructed inexpensively.

The external resonator 115, which is a so-called Fabry-Perot resonator, is in resonant oscillation when the optical path phase difference Δ is equal to an integer number multiple of 2 π, and is changed significantly in reflective phase in the vicinity of the phase of resonance. As disclosed in "Laser Phase and Frequency Stabilization Using an Optical Resonator", by R. W. Drever et al., Applied Physics B 31.9–105 (1983), frequency control of the resonator may be performed by taking advantage of such phase change. It is this technique that is utilized in the external oscillator 115.

Figure 3:
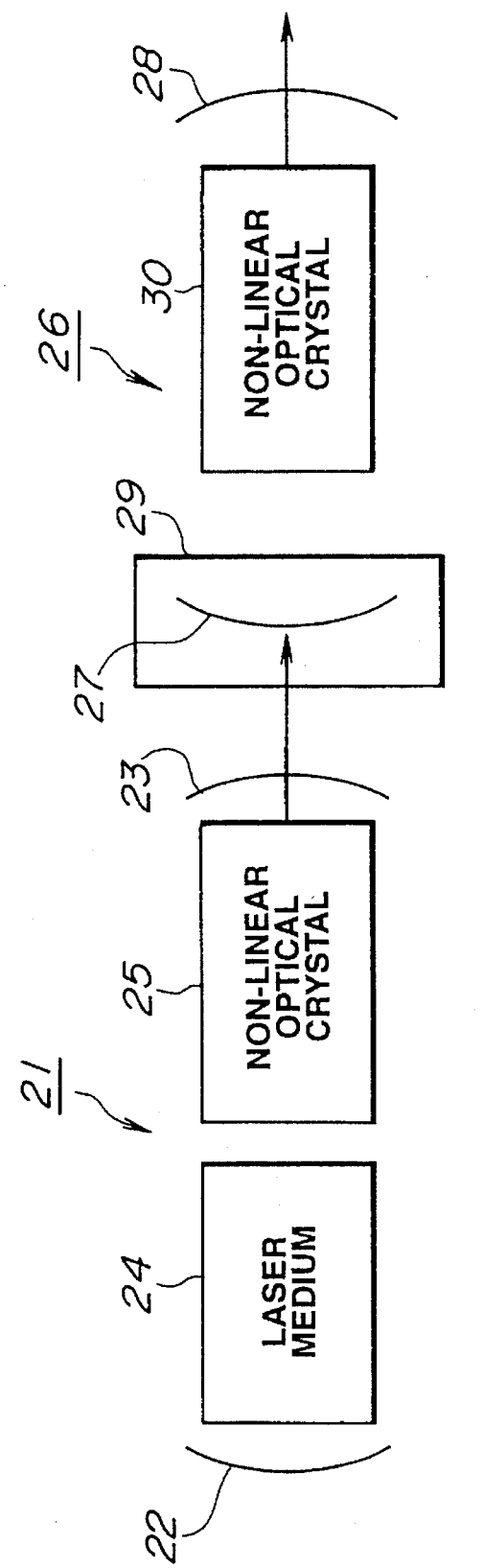
FIG. 3 is a block diagram for illustrating the basic arrangement for generating fourth harmonics when employing a SHG laser.

Since an ultraviolet light of a shorter wavelength is required in the semiconductor exposure device of the present invention, an arrangement shown in FIG. 3 is employed as a laser light source. Such laser light source 21 is a SHG laser oscillator.

The laser light source 111 of the ultraviolet laser light radiating unit 10 is comprised of a laser medium 24, such as Nd:YAG, and a non-linear optical crystal device 25, such as KTP (KTiOP$_4$), between a pair of reflective surfaces 22 and 23 of the resonator 21, as shown in FIG. 3. The basic wave laser of a wavelength from the laser medium 24 is passed through the non-linear optical crystal device 25 and driven into resonant oscillations for generating the SHG laser light which is routed to an external resonator 26. One of reflective surfaces 27, 28 of the external resonator 26, for example, the reflective surface 27, is driven along the optical axis by the electro-magnetic actuator 29. From a non-linear optical crystal device 30, such as BBO, enclosed in the external resonator 26, a laser light beam which represents second harmonics of the incident laser light, that is fourth harmonics of the original basic laser light beam, is produced and taken out at the external resonator 26.

Figure 4:
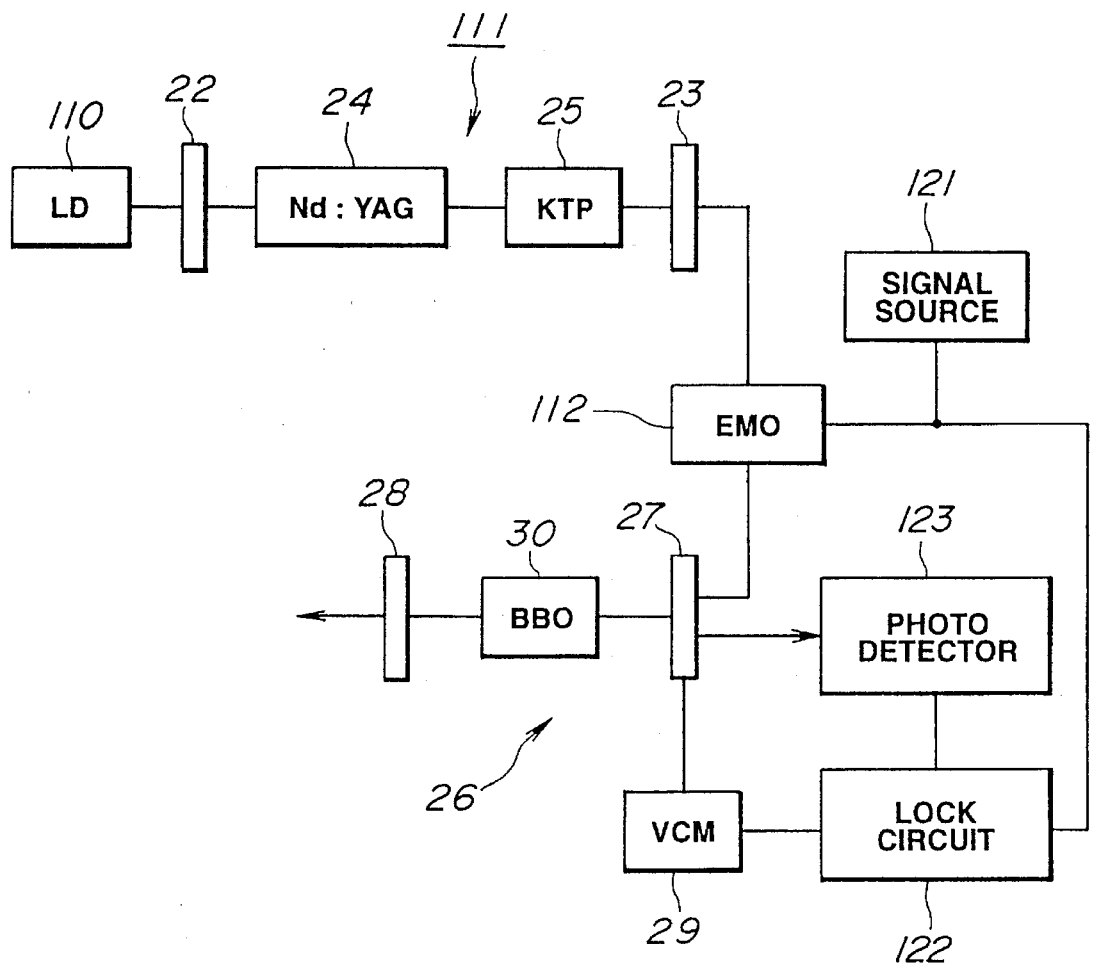
FIG. 4 is a block diagram for illustrating an arrangement of an ultraviolet laser light source radiating portion of a second embodiment of a semiconductor light exposure device according to the present invention.

By way of a concrete example, the ultraviolet laser light radiating unit 10 is constructed as shown for example in FIG. 4, in which parts or components common to those shown in FIGS. 1 and 2 are correspondingly numbered and not specifically explained and specific numerical values are given for the laser wavelength and so forth.

The laser diode 110, a semiconductor laser, transmits a laser beam of a wavelength of 810 nm, to the laser light source 111 which employs a laser medium Nd:YAG and causes the basic wave laser light with the wavelength of 1064 nm to be oscillated in resonance at the KTP 25 to output second harmonics having a wavelength 532 nm equal to one-half the above-mentioned wavelength to an electro-optical modulator (EOM) 112. The laser beam of a frequency $f_c$ of the laser light source 111, such as on the order of 500 to 600 THz, is phase-modulated by a phase modulator 112 with a frequency $f_m$ such as 10 Mhz, and a side band $f_c \pm f_m$ is set. The phase-modulated carrier frequency signal is supplied from the signal source (oscillator) 121. The return light from the external resonator 26, having the resonant frequency $f_0$ is routed to a photodetector 23 where changes in the optical path length of the resonator are detected by the photodetector 123 by the FM sideband method detecting the beat between the frequencies $f_c$ and $f_c \pm f_m$ in order to detect a position error detection signal having a polarity corresponding to the minimum reflectance position of the resonator. The reflective surface 27 is moved along the optical axis by a voice coil motor 29 of the electro-magnetic actuator 29 until the position error difference signal is reduced to zero. For achieving high precision position error detection, the error signal is taken out by a lock circuit 122 made up of the synchronous detector 122b, LPF 122c and the drivers 122a and 122d shown in FIG. 2.

By controlling the optical path length to $L_R$ so that the error signal is reduced to zero, and outputting the result via the BBO 30 in the external resonator 28, the second harmonics are converted into fourth harmonics, that is a laser light of an ultraviolet wavelength, which is outputted at a dichroic mirror 28.

The laser medium is not limited to Nd:YAG and Nd:YVO$_4$, Nd:BEL or LNP may also be employed. The non-linear optical crystal device may be exemplified by LN, QPM, LN LBO or KN, in addition to KTP and BBO.

Figure 5:
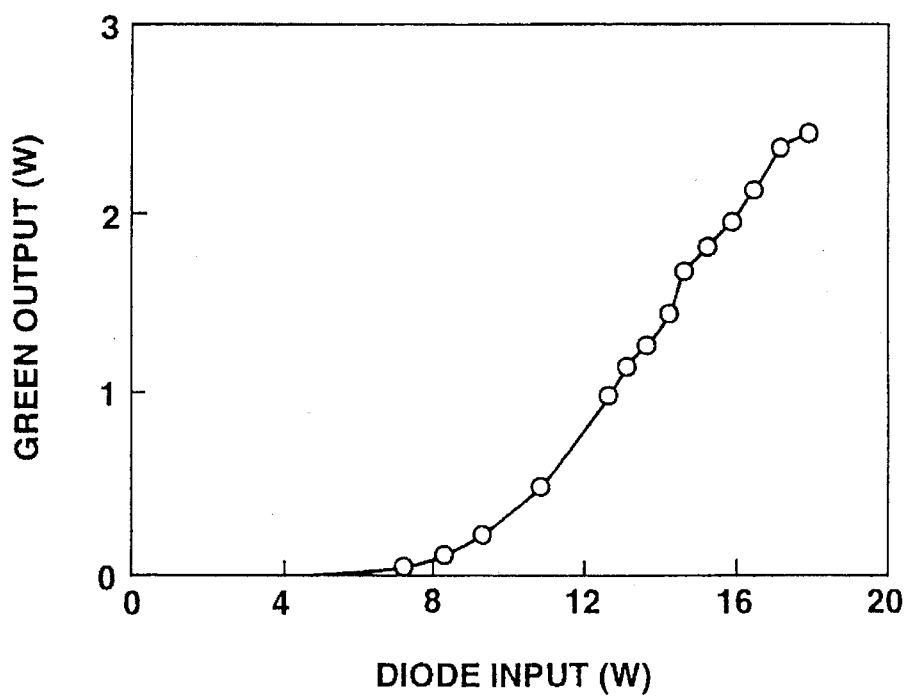
FIG. 5 is a graph showing the relation between an output level of second harmonics and an laser light incident level.

The input and output levels of the second and fourth harmonics, generated by the ultraviolet laser light radiating unit 10, are now explained by referring to FIGS. 5 and respectively.

In FIG. 5, the excitation power level (W) of the basic wave laser light having the wavelength of 1064 nm, with the laser medium of the semiconductor laser being Nd:YAG, is plotted on the abscissa, and the output level W (green output) of the second harmonics (532 nm) of the basic wave laser generated by the resonator 111 is plotted on the ordinate. Thus it is seen that, for the excitation input power of 18 W at the maximum, the second harmonics of 2.7 W are produced.

Figure 6:
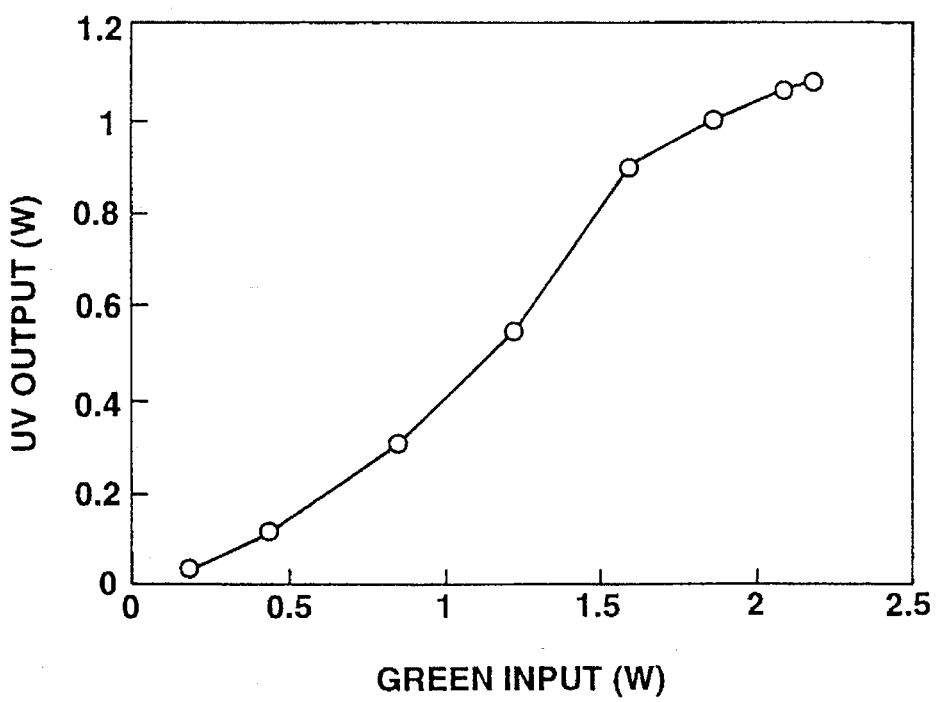
FIG. 6 is a graph showing the relation between an output level of fourth harmonics and an input level of second harmonics.

In FIG. 6, the input/output level of the fourth harmonics (266 nm) generated for the input of the second harmonics is shown, with the input level W and the output level W being plotted on the abscissa and the ordinate, respectively. It is seen from FIG. 6 that, for the input of the green light of 2 W, an ultraviolet output level of 1 W is produced. The continuous UV output of 1 W is sufficient to sensitize the resist for the eximer laser sufficiently. The spectral bandwidth of the UV light of 1 W, which is 2 pm even with the use of the narrow band filter of the eximer laser, may be reduced to 0.2 pm, and the laser power is concentrated in this narrow band. The UV light of 1 W is of the single transverse mode and the laser light is radiated as a uniform light beam.

Figure 7:
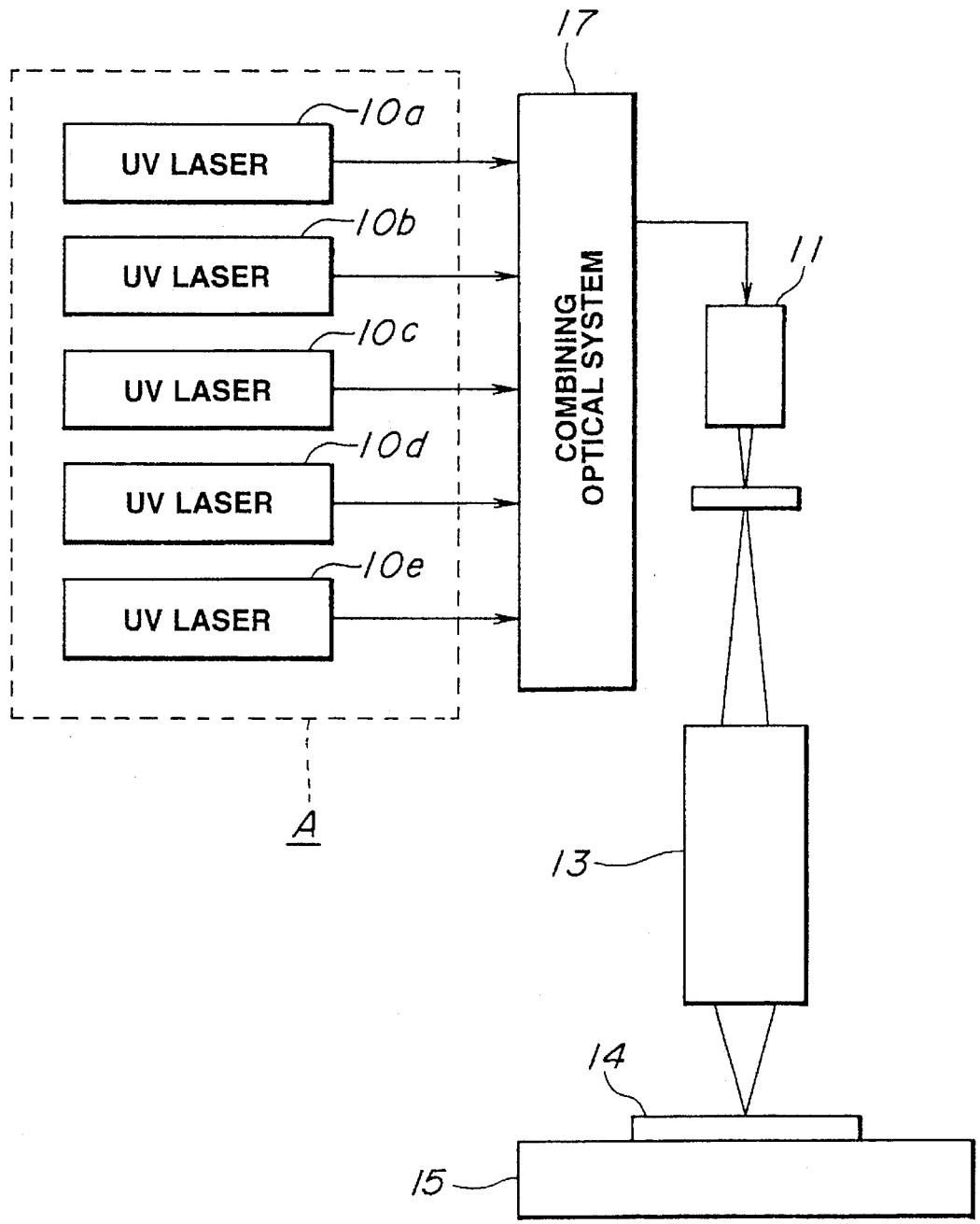
FIG. 7 is a block diagram showing a second embodiment of a semiconductor light exposure device according to the present invention.

Referring to FIG. 7, a second embodiment of the semiconductor exposure device of the present invention is explained. In FIG. 7, parts or components common to those of FIG. 1 are correspondingly numbered and are not explained specifically.

The semiconductor exposure device includes a laser beam radiation section A, made up of five UV laser light sources 10a to 10e, each being of the same construction as the ultraviolet laser light radiating unit 10 and capable of continuous radiation of a 1 W laser beam, and a combining optical system 16 for combining the 1 W laser beams from the laser radiation section A.

The combining optical system 16 combines the laser beams by optical components, such as mirrors or prisms. When the output level sums up to approximately 5 W, a laser power is produced, so that the application and usage is amplified.

Figure 8:
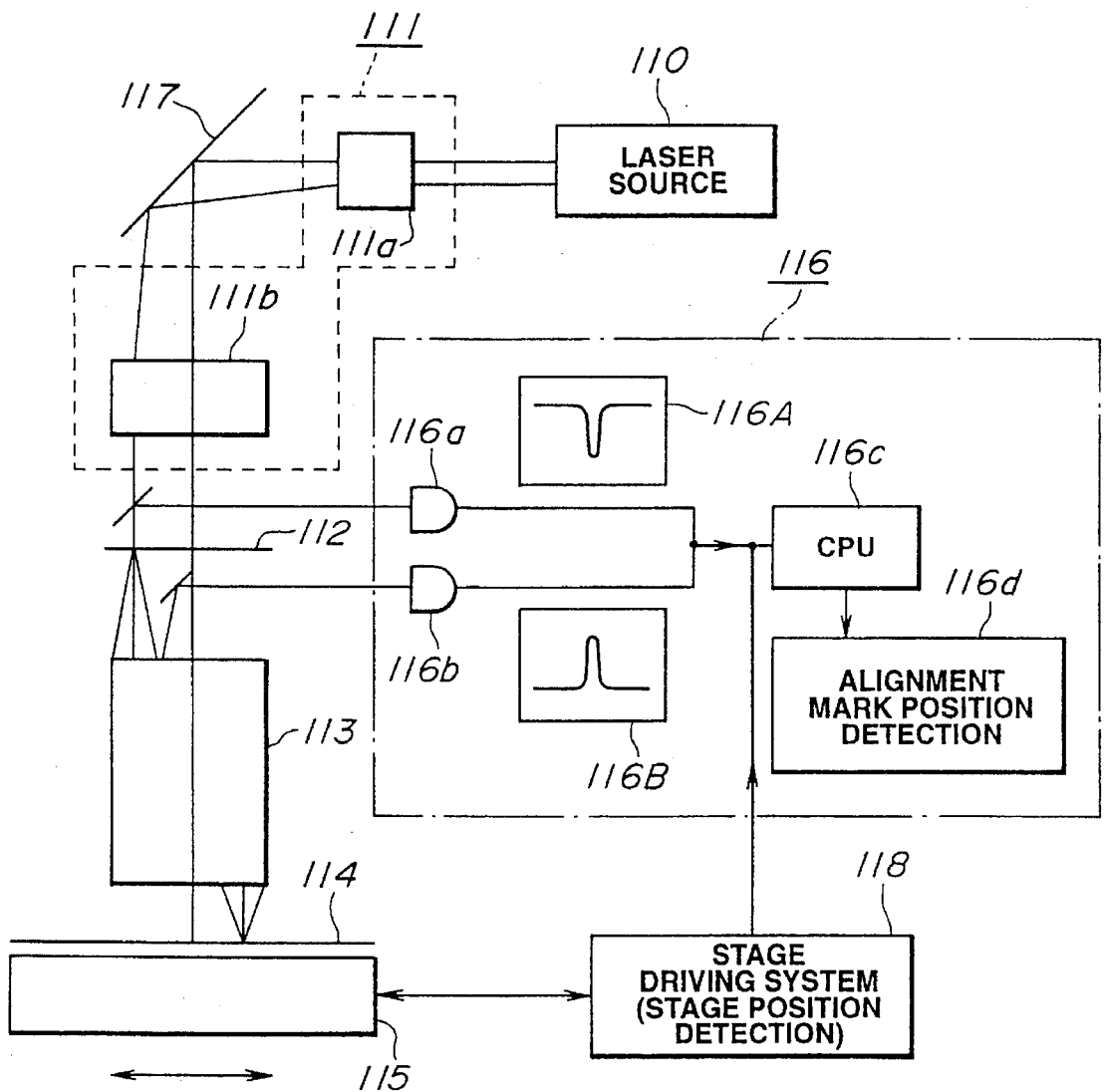
FIG. 8 is a block diagram showing a third embodiment of a semiconductor light exposure device according to the present invention.

Referring to FIG. 8, a third embodiment of the semiconductor exposure device of the present invention is explained. With the semiconductor exposure device, it is possible to control precisely the position relative to a wafer of an illuminated light image which is produced by radiating the light beam from the light beam generator on the reticle and which subsequently forms an image on the wafer by an image-forming optical system.

As shown in FIG. 8, the semiconductor exposure device has its basic construction common to that of the above-described first embodiment. That is, the semiconductor exposure device of the third embodiment includes an ultraviolet laser light radiating unit 110 in which a laser light emitted by diode laser excitation is wavelength-converted within a first resonator and the light wavelength-converted in an external resonation type second resonator from an outgoing light from the first resonator illuminates a reticle 112 via an illuminating optical system, and a contraction projection lens 113 for forming an optical image produced on irradiating the reticle 112 from the radiating unit 110 on a wafer 114. The exposure device also includes an XY stage 115 for moving the wafer 114 and an alignment unit 118 for detecting the position of the image formed by the contraction projection lens 113 on the wafer 114 and for effecting position matching.

The ultraviolet laser light radiating unit 110 introduces the light outgoing from a laser diode (enclosed semiconductor laser) into the laser medium in the first resonator for exciting the laser medium to create a laser beam having a wavelength of the fourth harmonics with respect to the wavelength of the laser beam originally generated by the semiconductor laser. The detailed construction of the ultraviolet laser light radiating unit 110 will be explained subsequently. The outgoing light having the wavelength of the fourth harmonics continuously oscillates a 266 nm wavelength laser light of a narrow width and exhibits high oscillation mode uniformity.

The laser light radiated by the ultraviolet laser light radiating unit 110 is highly coherent and hence susceptible to noise, such as speckle noise. The light source for exposure is radiated on the reticle 112 via an integrator 111 as an illuminating optical system 111. The integrator 111 reduces the coherence of the light source by employing a rotary diffusion plate or a ground glass or by transmission through a fly-eye lens 111a shown in FIG. 8. The integrator also shapes the beam by a condenser lens 111b to form a laser beam 200 mm in diameter exhibiting a uniform light intensity distribution.

The pattern on the reticle 112 is the original picture pattern enlarged to a five-fold size, as mentioned above. The light transmitted through the reticle 112 is exposed and radiated via the contraction projection lens 113 on a resist coated on the wafer 114. The contraction projection lens 113 transmits the image of the incident light to project an optical image contracted to a one-fifth the size on the wafer 14 to form a fine pattern.

There is provided a mark on the wafer 114 for correctly transcribing the original picture pattern drawn on the reticle 112 at a correct position on the wafer. An aligner 116 includes an optical system coaxial with the optical axis of the exposure light source. The aligner radiates a Nd:YAG laser with a wavelength of 532 nm, second harmonics from the ultraviolet laser light radiating unit 10, and detects the mark position on photodetectors 116a, 116b, on the basis of the return light from the wafer 114 in order to effect positional control depending on the state of positional matching between the reticle 112 and the wafer 114. The alignment will be explained subsequently. When the XY stage 115 is moved sequentially, the stage driving circuit 118 detects the stage position so that alignment positioning is effected by the stage position detection signal. The semiconductor exposure device repeatedly exposes the wafer while controlling the alignment using the above information. The semiconductor exposure device transcribes the pattern of the original picture correctly on the entire wafer surface.

The alignment of the semiconductor exposure device is now explained.

For a light source required for such alignment, the ultraviolet laser light radiating unit 10 employs a material having optical transmission characteristics on at least the outgoing side of a pair of reflecting mirrors, that is a material capable of transmitting not only the fourth harmonics radiated from the enclosed second resonator but also the second harmonics supplied by the enclosed first resonator to the second resonator, and radiates two laser light beams of different wavelengths.

With the semiconductor exposure device, the second harmonics, radiated simultaneously with the fourth harmonics for exposure, are conducted to the wafer 114 via the fly-eye lens 111a, mirror 117, condenser lens 111b and the contraction projection lens 113.

On the wafer 114, square-shaped alignment marks are formed at a pre-set pitch. When the second harmonics are radiated on the wafer 114, the laser light is reflected or diffracted by the alignment marks. The reflected or diffracted light is transmitted to and observed at the alignment unit 116.

The alignment unit 116 is provided with through-the-lens (TTL) system photodetectors 116a, 116b. With the TTL system light detection, the alignment mark on the wafer 114 and the corresponding alignment mark on the reticle 112 are observed simultaneously on the photodetector 116a, and the two marks are matched directly to each other. With the present embodiment, the mark on the reticle 112 is used as a window, and a position of the minimum reflected light from the mark position on the wafer 114 in the window is detected by way of performing the bright field detection.

From the photodetector 116a, performing the bright field image detection, an output waveform shown at 116A in FIG. 8 is produced. An output of the photodetector 116a is inputted to a CPU 116c which performs arithmetic-logical operations for finding relative displacement between the mark on the reticle 112 and the mark on the wafer 114. Positioning is carried out at an alignment mark position detection circuit 116d.

The other photodetector 116b is mounted at a position capable of detecting the light of the first order diffraction from the alignment mark in the form of a diffraction lattice provided on the wafer 114. The light detection by the photodetector 116b is by dark field detection. That is, an output waveform shown at 116B in FIG. 8 is produced by the photodetector 116b. With the dark field detection, while the XY stage 115 is moved, an acute peak of the output waveform by the light of the first diffraction as detected by the photodetector 116b is observed for detecting the mark position on the wafer 114. The mark on the reticle 112 is detected by another optical system and the correct position of alignment is calculated by the CPU 116c from the thus detected relative position, and the alignment mark position detection circuit 116d performs the positioning. The positional deviation resulting from the thus found positions is fed to a stage driving circuit 118 for moving the XY stage 115 in a controlled manner.

Figure 9:
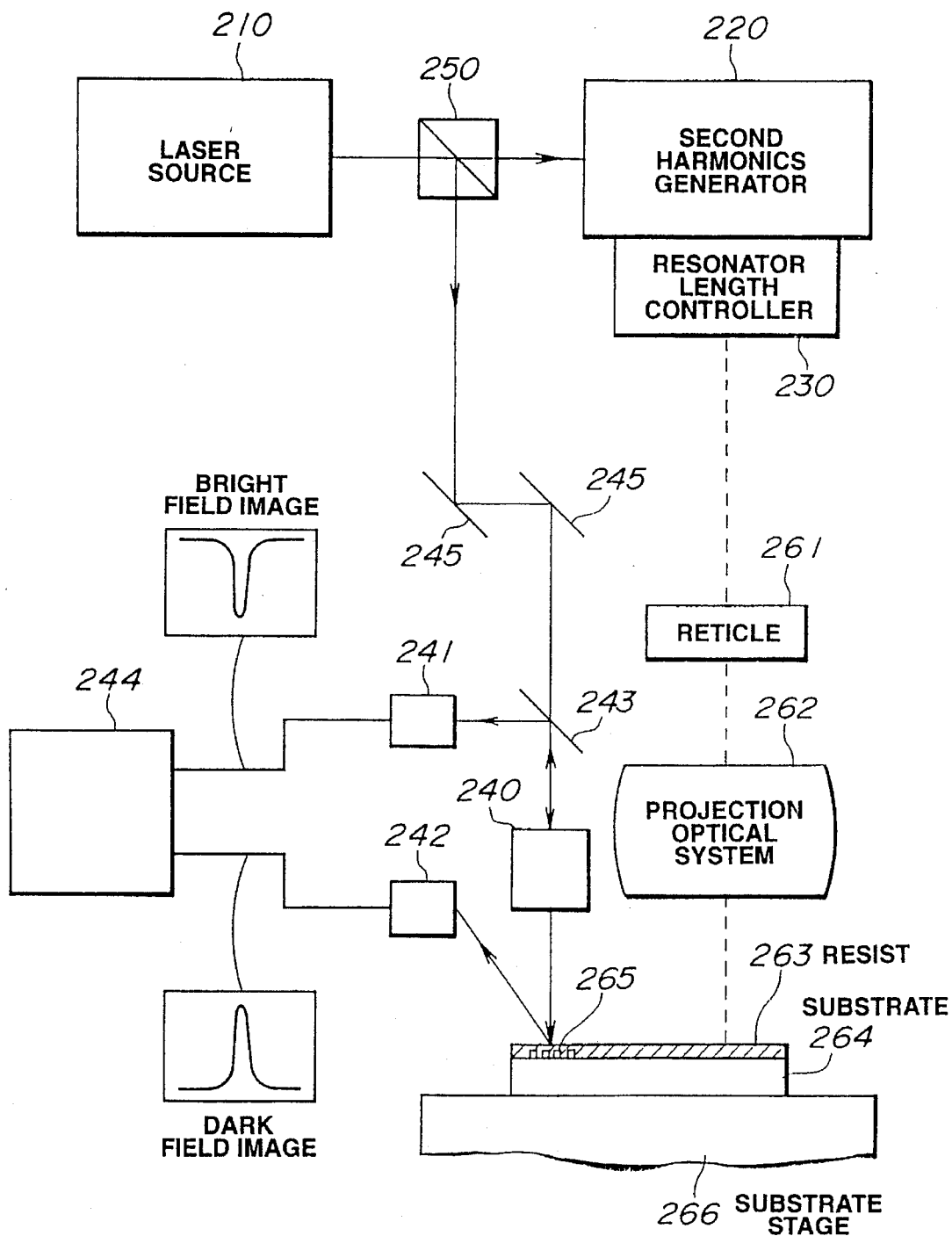
FIG. 9 is a block diagram showing a fourth embodiment of a semiconductor light exposure device according to the present invention.

Referring to FIG. 9, a fourth embodiment of the semiconductor exposure device of the present invention is explained. As shown in FIG. 9, the semiconductor exposure device includes a light source for a projection optical system, an off-axis alignment detection system and a light path splitting means.

The light source for the projection optical system is made up of a laser light source 210 and a second harmonics generator 220. The light radiated from the laser light source 210 is incident on the second harmonics generator 220 which radiates a light having a wavelength corresponding to the second harmonics of the incident light. The light radiated from the second harmonics generator 220 illuminates a reticle 281 so as to cause the pattern on the reticle 261 to be transcribed via a projection optical system, such as a contraction projection lens 262, on a resist 283 formed on a substrate 284. The pattern formed on the reticle 261 is a pattern which is to be formed on the resist 283 and which has been enlarged by, for example, a factor of five. The projection optical system 282 transmits the incident light and projects an optical image, contracted to a one-fifth size, on the resist 263 formed on the substrate 264. A fine pattern is formed in this manner on the resist 263. The substrate 264 is set on a substrate stage 266.

The semiconductor exposure device of the present embodiment also has light path splitting means 250 for splitting the light path of the light radiated from the laser light source 210. The light split by the light path splitting means 250 becomes an illuminating light source for the off-axis alignment detection system. The optical path splitting means 250 is made up of a half-mirror or a beam splitter.

The off-axis alignment detection system is made up of an alignment microscope 240, a first photodetector 241 for detecting the 0th diffraction light, a second photodetector 242 for detecting the ±1st diffraction light, a half mirror 243 for causing the 0th order diffracted light reflected by the substrate 264 to fall on the first photodetector 241 and a signal processor 244 for processing signal outputs of the photodetectors 241, 242. The alignment microscope 240 is an ordinary optical microscope having a small numerical aperture NA. The off-axis alignment detection system includes a rotary polygonal mirror, not shown, for scanning the light split by the light splitting means 250. Thus the light radiated from the laser light source 210 and split by the light path splitting means is passed through the reflective mirror 245, rotary polygonal mirror, half mirror 243 and the alignment microscope 240 so as to be illuminated on and scan the substrate 264 carrying the resist 263 and the alignment mark 265 at a constant velocity. The light diffracted, scattered and reflected by the alignment mark 265 is detected by the first and second photodetectors 241, 242. The numeral 245 denotes a reflective mirror.

An output signal of the first photodetector 241 which has received the 0th order diffracted light is processed by a signal processor 244 to produce a bright field image which is observed with a CRT. The bright field image may be produced by signal superposition. Although an image having excellent reproducibility may be obtained by signal output averaging effects, the bright field image has only poor resolution in the alignment mark detection. An output signal of the second photodetector 242 having received the ±1st order diffracted light from the alignment mark 265, a grating formed on the substrate 264, is processed by the signal processor 244 for producing the dark field image. Although higher in resolution in alignment mark detection than the bright field image, the dark field image has only poor image reproducibility since the diffraction angle depends to a large extent on such factors as the shape of the alignment mark 265. FIG. 9 schematically shows signal outputs of the first and second photodetectors 241, 242 when the alignment mark 265 on the substrate is observed. By combining the bright field image and the dark field image, the position of the alignment mark 265 can be detected with high accuracy.

The alignment operation in accordance with the off-axis alignment system is now explained.

First, using the projection optical system 262, the reticle 261 is aligned with a reference mark (fiducial mark), not shown, provided on the substrate stage 266. Such alignment is achieved by aligning the alignment mark provided on the reticle 261 with the reference mark. The relative position between the substrate 264 set on the substrate stage 266 and the reference mark is then observed.

The substrate stage 266 is then movd so that the alignment mark 265 provided on the substrate 264 is directly below the alignment microscope 240, and the (X, Y) coordinates of the alignment mark is determined based upon signal outputs of the first and second photodetectors 241, 242. Since the image-forming position of the projection optical system 262 and the relative position (baseline) of the off-axis alignment detection system are pre-measured, the desired substrate portion may be moved to the image-forming position of the projection optical system 262 if the substrate sage 266 is moved based on the measured values of the baseline and the coordinates (X, Y) of the alignment mark.

Alternatively, the alignment operation may be carried out by the off-axis alignment system using a photochromic material. In such case, the photochromic material is pre-arranged at an outer edge portion of the substrate stage 266. Using the projection optical system 262, the reticle alignment mark, formed by a grating provided on the reticle 261, is printed on the photochromic material arranged on the substrate stage 266.

The, using the off-axis alignment detection system, the reticle alignment mark printed on the photochromic material is observed. By measuring the X, Y coordinates of the reticle alignment mark, it becomes possible to produce the relative position (baseline) between the image-forming position of the projection optical system 262 and the off-axis alignment detection system.

The substrate stage 266 is then moved until the alignment mark 265 provided on the substrate 264 is directly below the alignment microscope 240. The X, Y coordinates of the alignment mark is determined on the basis of signal outputs of the first and second photodetectors 241, 242. Since the image-forming position of the projection optical system 262 and the relative position (baseline) of the off-axis alignment detection system have been found by the above-described method employing the photochromic material, the desired substrate portion may be moved to the image-forming position of the projection optical system 262 by shifting the substrate stage 266 based on the baseline value and the measured X, Y coordinates of the alignment mark.

After the desired substrate portion has been moved in this manner to the image-forming position of the projection optical system 262, the pattern formed on the reticle 261 is transcribed via the projection optical system 262 onto the resist 263 formed on the substrate 264 with the use of the light radiated by the second harmonics generator 220.

Figure 10:
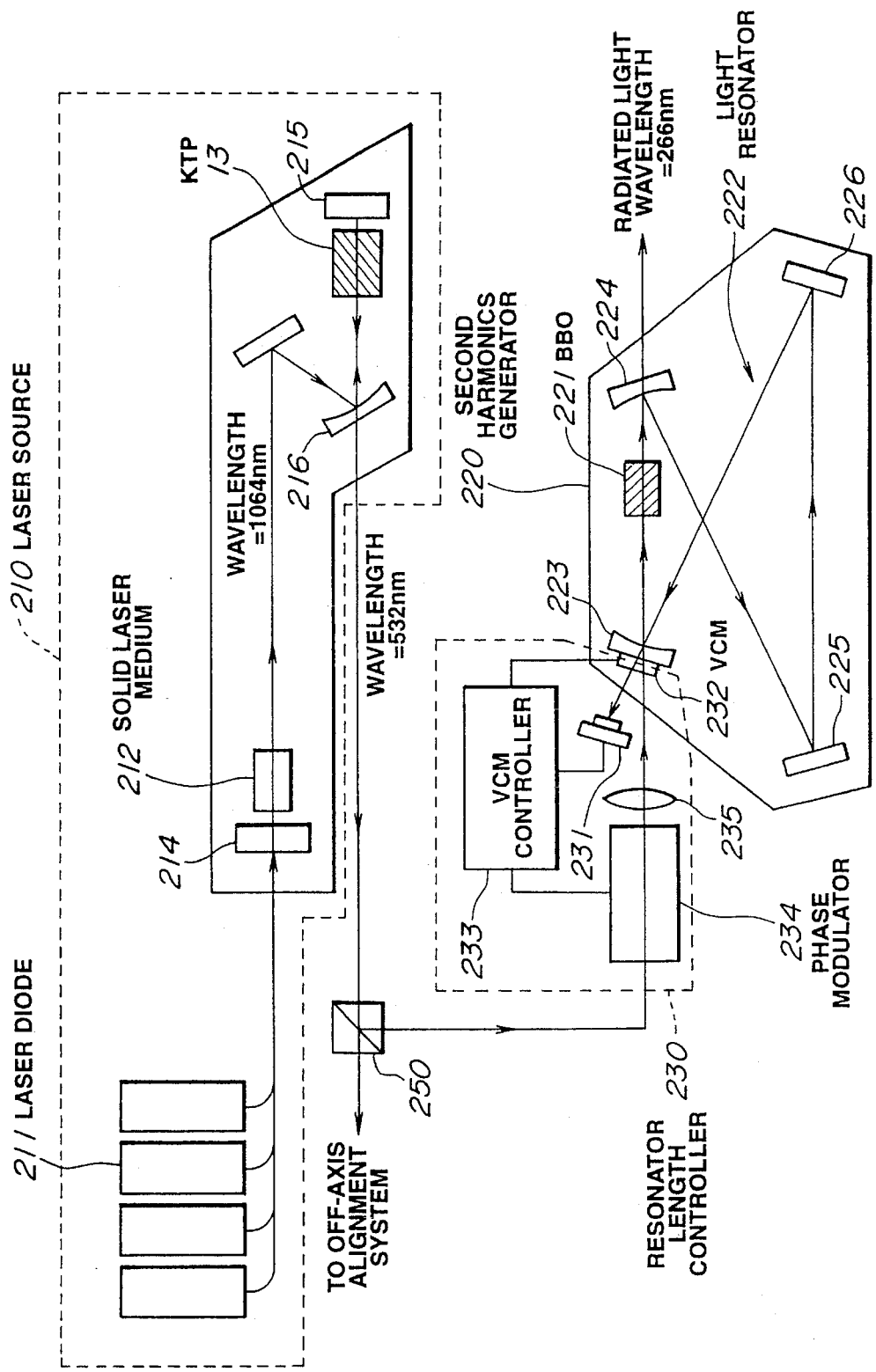
FIG. 10 is a schematic view showing a laser light source, a second harmonics generator and a resonator controller employed in the device shown in FIG. 9.
Figure 11:
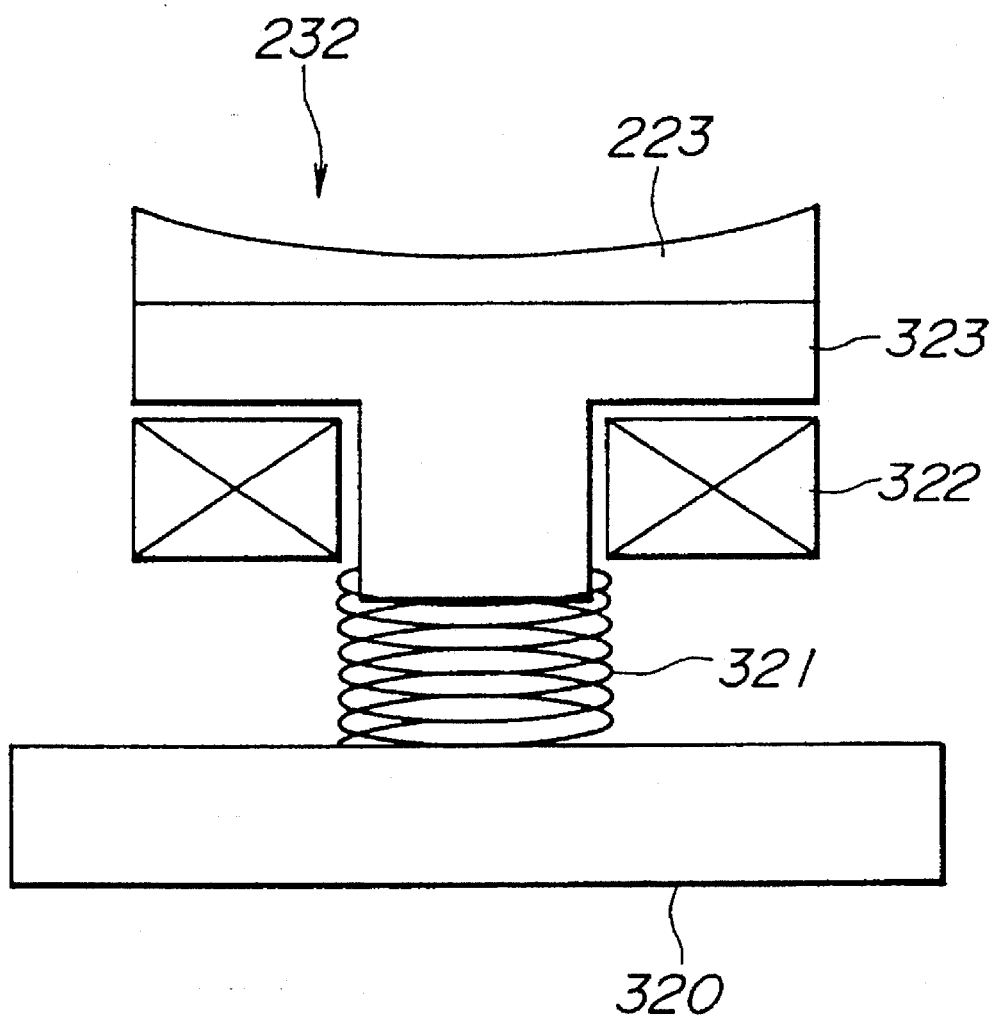
FIG. 11 is a schematic view showing a voice coil.

Referring to FIGS. 10, 11 and 4, the laser light source suitable as the light source for the projection optical system and the second harmonics generator 220 will be explained.

The laser light source 210 is comprised of an LD excitation solid-state laser which is made up of a laser diode 211, a solid-state laser medium 212 formed of Nd:YAG and a non-linear optical crystal device 213 and which is capable of radiating second harmonics. The second harmonics generator 220 is comprised of a non-linear optical crystal device 221 and a light resonator 222. The second harmonics generator 220 is further provided with a resonator length controller 230 for controlling the length of the light resonator 222.

The light radiated by the laser light source 210 is split by optical path splitting means 250 and is transmitted to the off-axis alignment detection system and to the light resonator 222 making up the second harmonics generator 220 during the alignment operation and during the resist printing operation, respectively. The second harmonics generator 220 radiates the light having the wavelength corresponding to the second harmonics of the light incident on the light resonator 222 (fourth harmonics if based on the laser light generated by the laser medium).

The laser light source 210 is made up of plural laser diodes 211 radiating the laser light having the wavelength of 808 nm, a solid laser medium 212 formed of Nd:YAG, radiating the laser light having the wavelength of 1064 nm, and a non-linear optical crystal device 213, formed of KTP (KTiOPO$_4$), as shown in FIG. 10. The solid laser medium 212 is of an end face excited type. Thus the laser light source 210 radiates the light of 532 nm corresponding to the second harmonics of the solid-state laser medium formed of Nd:YAG. The laser light source 210 has a quarter wave plate 214 ahead of the laser medium 212 formed of Nd:YAG.

Thus it becomes possible with the laser source to suppress the multi-mode oscillation by the so-called hole burning effect.

The non-linear optical crystal device 213 is arranged in the light path of the light resonator made up of a plane mirror 215 and a concave mirror 216 in accordance with the external SHG system (the system in which the device 213 is arranged in a light resonator arranged externally of the laser oscillator). The plane mirror 215 reflects substantially all of the second harmonics, while the concave mirror 216 transmits substantially all of the second harmonics of the solid laser medium formed of Nd:YAG and reflects substantially all of other wavelength light. The concave mirror 216 may be constituted by, for example, a dichroic mirror.

Referring to FIG. 10, the second harmonics generator 220 is made up of a non-linear optical crystal device 221 of, for example, BBO ($\beta$-BaB$_2$), and a light resonator 222. The non-linear optical crystal device 221 making up the second harmonics generator 220 is arranged on the light path of the light resonator 222. That is, the second harmonics generator 220 is of the so-called external SHG system. With the light resonator 222, the finess value (corresponding to Q of resonation) is set to a larger value on the order of 100 to 1000, and the light density in the light resonator is set to hundreds of times of the light density of the incident light to the light resonator 222 in order to utilize non-linear effects of the non-linear optical crystal device 221 arranged in the light resonator 222 effectively.

The light resonator 222 is made up of a pair of concave mirrors 223, 224 and a pair of plane mirrors 225, 226. The light incident on the second harmonics generator 220, such as the light having the wavelength of 532 nm, is transmitted through the first concave mirror 223 and the non-linear optical crystal device 221 and at least a portion thereof is converted to second harmonics having the wavelength of, for example, 266 nm. The light is then reflected by the second concave mirror 224 and by the plane mirrors 225, 226 and subsequently by the first concave mirror 223. In such state, at least a portion of the incident light on the second concave mirror 224, having the wavelength of, for example, 266 nm, is transmitted through the second concave mirror 224 so as to be radiated from the second harmonics generator 220 towards the reticle 261. A portion of the light incident on the first concave mirror 223 from the plane mirror 226, such as the light having the wavelength of 532 nm, is transmitted through the first concave mirror 523 so as to fall on the resonator length controller 230 as later explained. The first and second concave mirrors 223, 224 and the plane mirrors 225, 226 are designed to reflect and transmit the light as described above. The second concave mirror 224 may be arranged by, for example, a dichroic mirror.

The light radiated from the second harmonics generator 220 is the second harmonics of the light incident on the second harmonics generator 220. That is, the light incident on the second harmonics generator 220 has a wavelength of 532 nm, while the light radiated from the second harmonics generator 220 has a wavelength of 266 nm. If the wavelength (1064 nm) of the laser light radiated from the second harmonics generator 220 radiated from the Nd:YAG solid-state laser medium 212 is used as a reference, the light radiated from the second harmonics generator 220 is the fourth harmonics. The second harmonics generator 220 continuously radiates the laser light having the narrow bandwidth of 266 nm and having high mode uniformity.

The second harmonics generator 220 has the resonator length controller 230. The resonator length L of the light resonator 222 is precisely controlled by the resonator length controller 230 so as to be maintained at a constant value. By maintaining the resonator length L of the light resonator 222 at a constant value, the intensity of the light radiated from the second harmonics generator 220 may be maintained at a constant value. The resonator length L corresponds to the length of the light path interconnecting the reflecting surfaces of the first concave mirror 223, second concave mirror 224, plane mirrors 225 and 226 and the first concave mirror 223.

If the wavelength of the light radiated from the second harmonics generator 220 is $\lambda$, the light resonator 222 is in resonant oscillation for the length $L_0$ of the light resonator 222 satisfying the relation $\lambda = L_0/N$, N being a positive number, with the light resonator 222 stably radiating the high intensity light. Such state is also termed a locked state. In other words, the light resonator 222 constituting the second harmonics generator 220 is in resonant oscillation, that is in the locked state, if the optical path phase difference $\Delta$ in the light resonator 222 is equal to an integer number multiple of $2\pi$. With the refractive index n and the thickness of the non-linear optical crystal device 221 equal to 1, the optical path phase difference $\Delta$ may be represented by $(4\pi n l/\lambda)$.

If the length $L_0 \pm \Delta L_0$ of the light resonator 222 is such that $\lambda$ is not equal to $(L_0 \pm \Delta L_0)/N'$, N' being a positive number, the second harmonics generator 220 radiates the light of low intensity. Such state is also termed an unlocked state. In other words, if the optical path phase difference $\Delta$ in the light resonator 222 is deviated from a value equal to an integer number multiple of $2\pi$, the light resonator 222 constituting the second harmonics generator 220 is not in resonant oscillation, that is in an unlocked state.

Consequently, for stably radiating the light of the wavelength $\lambda$ from the second harmonics generator 220, it is necessary to diminish fluctuations of the resonator length L of the light resonator 222 with lapse of time, specifically, fluctuations in the locations of the concave mirrors 223, 224 and the plane mirrors 225, 226, to as small a value as possible. To this end, the first concave mirror 223 is moved on the optical axis interconnecting the first concave mirror 223 and the second concave mirror 224, or the mounting angle of the first concave mirror 223 relative to the optical axis is changed, under control by the resonator length controller 230, for suppressing fluctuations in the resonator length L of the light resonator 222 with lapse of time for maintaining a constant value of the resonator length L.

The resonator length controller 230 is described in detail in the specification of the JP Patent Application filed in the name of the present Assignee entitled "Laser Light Generator" (JP Patent Application No.5-243661).

The resonator length controller 230 is made up of a photodetector 231, such as a photodiode, a voice coil motor (VCM) 232, a voice coil motor control circuit (VCM control circuit) 233 and a phase modulator 234, as shown in FIG. 10. The phase modulator 234 is arranged on a light path between the laser light source 210 and the second harmonics generator 220 and is comprised of an electro-optical (E/O) device or an acousto-optical (A/O) device for phase modulating the light radiated from the laser light source 210. A condenser lens 235 is arranged between the phase modulator 234 and the second harmonics generator 220. The voice coil motor 232 is fitted with a first concave mirror 223 constituting light resonator 222.

As shown schematically in FIG. 11, the voice coil motor 232 is an electro-magnetic actuator comprised of a substrate 320 formed of a magnetic material, one or more electro-magnets or so-called voice coils 322, a yoke 323 formed of a magnetic material and at least one coil spring or spiral plate spring 321. The coil spring 321 has its one end mounted on the substrate 320 and its other end mounted on the yoke 323. The first concave mirror 223 and the electro-magnet 322 are mounted on the yoke 323. When the current is caused to flow in the electro-magnet 322, a magnetic field is generated and the distance between the yoke 323 and the substrate 320 is changed, as a result of which the first concave mirror 323 is shifted. That is, the resonator length L of the light resonator 222 may be changed by controlling the current flowing in the electro-magnet 322 by way of performing servo control on the voice coil motor 232.

The driving current for the voice coil motor 232 is on the order of tens to hundreds of amperes. In addition, the frequency of the double resonance of the servo loop may be set to 100 Khz or higher and relatively free of phase changes so that the servo band may be increased to tens of Khz to assure stable control.

If the light resonator 222 is in the locked state, the intensity of the light radiated from the first concave mirror 223 and reaching the photodetector 231 becomes locally minimum, while such light is changed significantly in phase. It is disclosed in "Laser Phase and Frequency Stabilization Using an Optical Resonator", by R. W. P. Drever et al., Applied Physics B31.97–105 (1983) to control the light resonator by utilizing such changes. The locked state of the light resonator 222 is basically controlled using this technique.

If the voice coil motor 232 is driven by the VCM control circuit 233 for changing the position of the first concave mirror 223 so that the light transmitted through the first concave mirror 223 to reach the photodetector 231 perpetually has the locally minimum intensity, for example, zero intensity, the lock state of the voice coil 222 may be maintained stably. In other words, the light radiated by the laser light source 210 is phase-modulated based on the phase modulated signal and incident on the second harmonics generator 220 and the return light from the second harmonics generator 220 is detected by the photodetector 231 to produce a detection signal. Such detection signal is synchronously detected by a phase modulated signal to take out an error signal. The voice coil motor 232 is driven by the VCM control circuit 233 for changing the position of the first concave mirror 223 so that the error signal will be reduced to zero.

Figure 12:
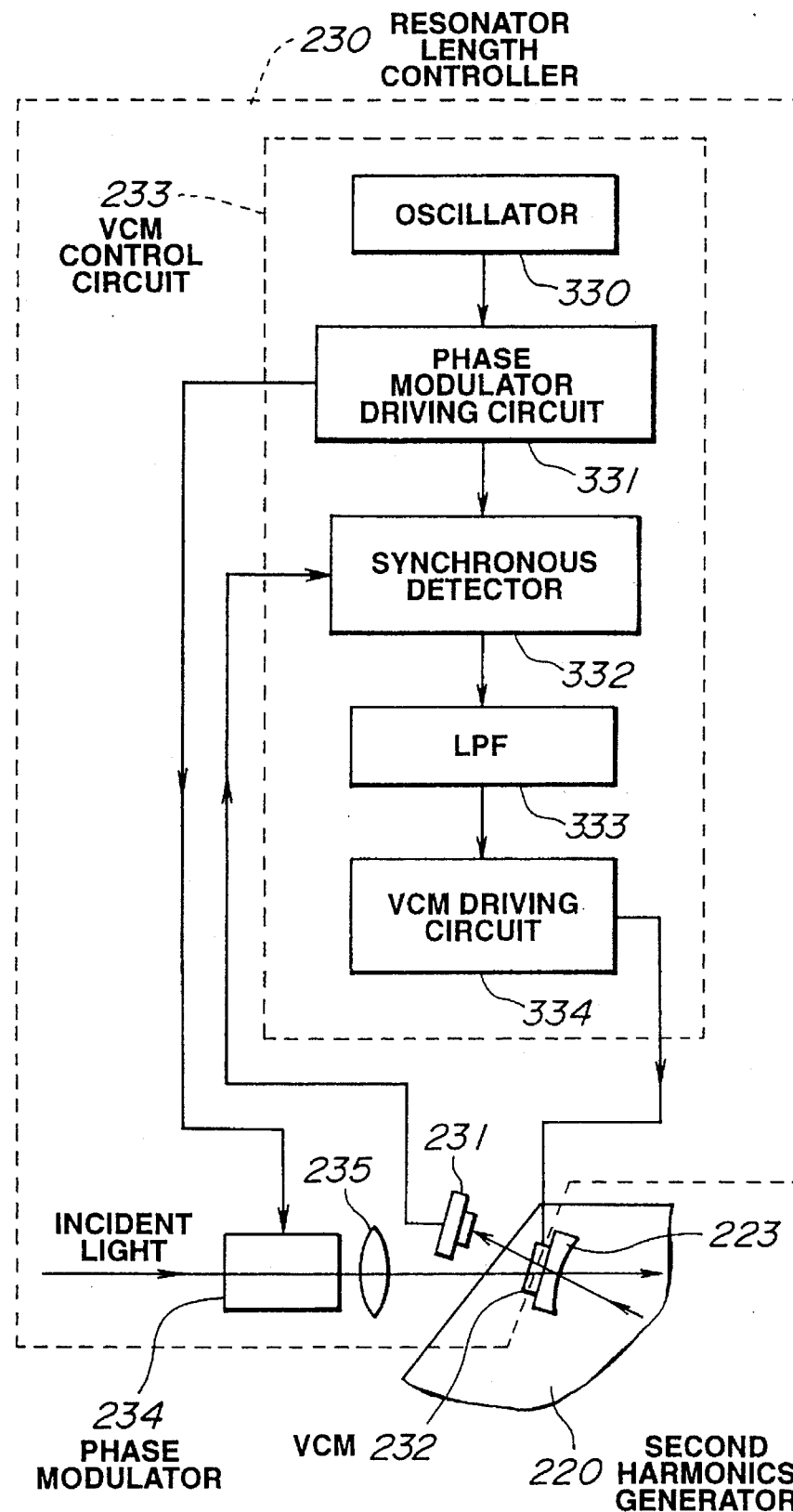
FIG. 12 is a schematic view showing a VCM control circuit constituting a resonator length controller.

The VCM control circuit 233 is made up of, for example, an oscillator 330, a phase modulation driving circuit 331, a synchronous detection circuit 332, a low-pass filter 333 and a voice coil motor driving circuit (VCM driving circuit) 334, as shown schematically in FIG. 12.

The modulated signal of the frequency $f_m$, such as 10 Mhz, outputted from the oscillator 330, is fed to the phase modulator 234 via the phase modulation driving circuit 331. The phase modulator 234 phase-modulates the light radiated from the laser source 210, having the frequency $f_0$ on the order of $10^{14}$ Hz, to generate side bands with the frequency $f_0 \pm f_m$.

The light transmitted through the first concave mirror 223 of the light resonator 222 so as to be radiated out of the light resonator 222 with the light frequencies $f_0$ and $f_0 \pm f_m$ is detected by the photodetector 231. An error signal having polarities may be produced by the FM sideband method detecting the beat between the light beams having the frequencies $f_0$ and $f_0 \pm f_m$ and the resonator length L of the light resonator 222 is controlled on the basis of such error signal.

An output signal of the light detector 231 is supplied to a synchronous detector 332. This signal is the intensity signal of the light having the frequency $f_0$ superposed on the modulated signal with the frequency $f_m$. The synchronous detector 332 is fed with the modulated signal outputted by the oscillator 330 and, if necessary, processed with wave-shaping and phase delay. The output signal of the photodetector 231 and the modulated signal are multiplied together by the synchronous detector 322 for synchronous detection. The detected output signal from the synchronous detector 332 is fed to the low-pass filter 333 where the detected output signal is freed of the modulated signal to generate an error signal of the resonator length of the light resonator 222. The error signal represents the difference ($\pm \Delta L_0$) between the set resonator length $L_0$ of the light resonator 222 and the measured resonator length ($L_0 \pm \Delta L_0$).

The error signal is routed to the VCM driving circuit 334 so that the voice coil motor 332 is driven by the error signal, specifically, the current flowing through the electro-magnet 322 is controlled, in such a manner that the resonator length L of the light resonator 222 is controlled so that the light transmitted through the first concave mirror 223 and reaching the photodetector 231 is of the minimum value, that is so that the error signal will be reduced to zero.

If the resonator length L of the light resonator 222 is set to $L_0$, that is in the locked state, fluctuations in the resonator length L of the light resonator 222 with lapse of time are suppressed to 1/1000 to 1/10000 of the wavelength of the light incident on the second harmonics generator 220 under control by the light resonator 222.

In the semiconductor exposure device, explained in the embodiment 4, the alignment mark position is detected using the strongly coherent light as the illuminating light source of the off-axis alignment detection system. Thus the resolution in alignment mark detection is excellent. Consequently, it may occur that, depending on the surface state of the substrate, the light of the illuminating light source is so intense in coherence that the alignment position detection accuracy becomes inferior during position detection of the alignment mark. In order to avoid such situation, a so-called broad-band light illumination is simultaneously used as the illuminating light source for the off-axis alignment detection.

Figure 13:
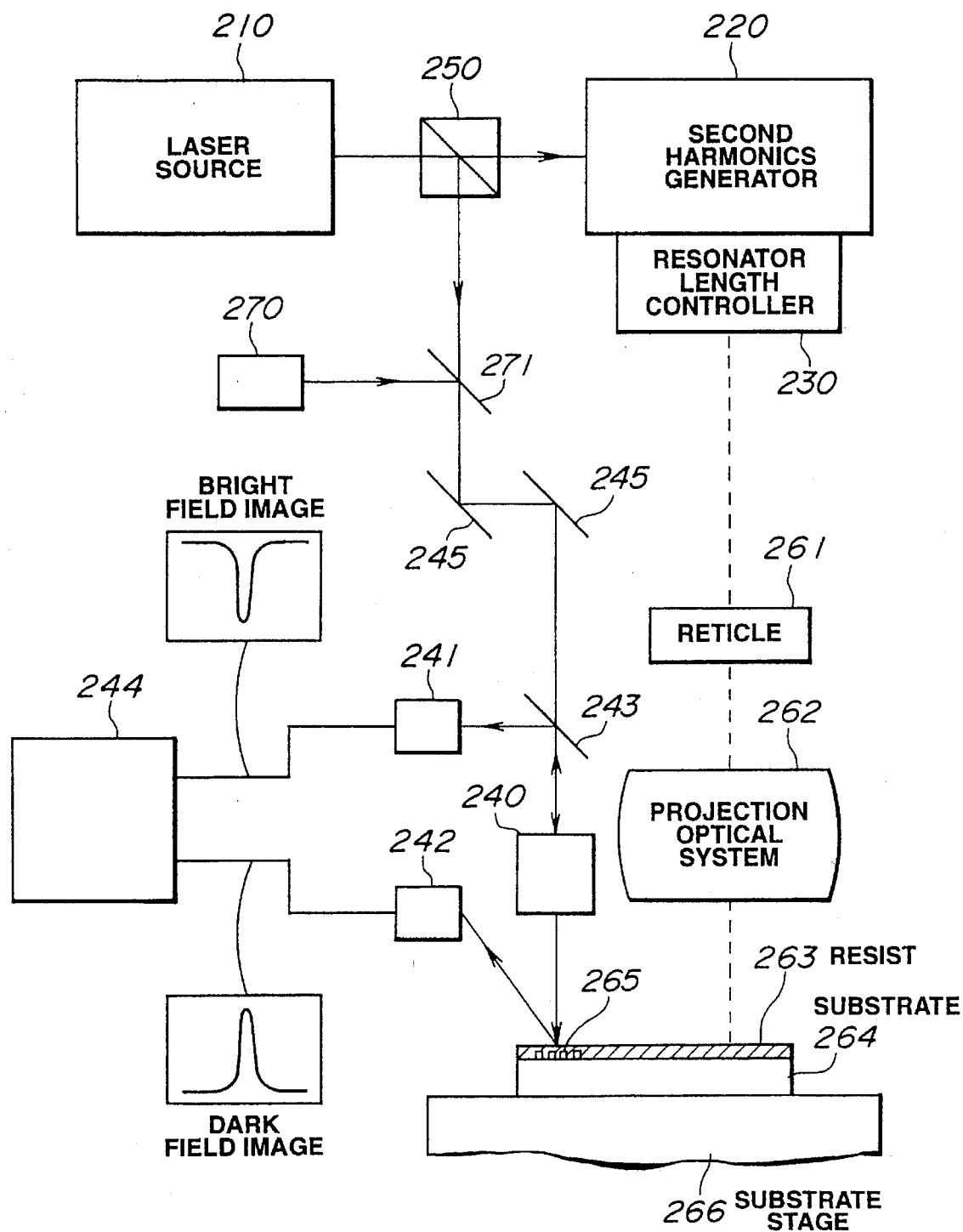
FIG. 13 is a block diagram showing a fifth embodiment of a semiconductor light exposure device according to the present invention.

Referring to the schematic view of FIG. 13, the light radiated by the laser source 210 is used in the semiconductor exposure device of the embodiment 5 as the illuminating light source of the off-axis alignment detection system, while a halogen lamp 270 is employed as an illuminating light source of the off-axis alignment detection system. Otherwise, the laser light source 210 is employed as the illuminating light source of the off-axis alignment detection system. In FIG. 13, the numeral 271 denotes a half-mirror.

Although the present invention has been described with reference to preferred embodiments thereof, the present invention is not limited to these embodiments. An optical fiber may be employed for transmitting the light from the light splitting means 250 to the alignment microscope 240. The light splitting means 250 may be any means other than the beam splitter or the half-mirror provided that it can split the optical path.

The semiconductor exposure device of the present invention is not limited to the projection exposure device employing the reflection type optical system as in the above-described embodiments, but may also be applied to a semiconductor exposure device or a proximity exposure device employing the reflection type optical system.

If, in the semiconductor exposure device explained in the embodiment 4, the light split by the light path splitting means is used as the illuminating light source or the alignment detection system, a rotary diffusion plate or a ground glass, for example, may be arranged between the optical path splitting means and the alignment microscope for lowering light coherence.

The construction of the laser light source 210, second harmonics generator 220 or the resonator length controller 230 is merely illustrative and may be modified in desired manner. The solid laser medium may also be formed of Nd:YVO$_4$, Nd:BEL or LNP, in addition to Nd:YAG. The solid laser medium exciting system by the laser diode may also be of the side or surface exciting system, in addition to the end face exciting system. A slab solid laser may also be employed. The non-linear optical crystal devices other than KTP or BBO, such as LN, QPM, LN, LBO or KN, may also be employed depending on the light wavelength required of the incident or outgoing light.

A so-called internal SHG system laser light source, having the solid laser medium and the non-linear optical crystal device arranged in the light path of a light resonator made up of a pair of reflective mirrors may also be employed. It is also possible to employ a construction in which the outgoing light from the solid laser medium 212 is transmitted through the non-linear optical crystal device 213, that is in which the light resonator made up of the plane mirror 215 and the concave mirror 216 is omitted. It is also possible to employ a blue semiconductor laser instead of the LD excited solid laser and to cause the light from the semiconductor laser to fall directly on the second harmonics generator, or to employ a combined structure of the semiconductor laser and the non-linear crystal device, that is a combined structure of the internal SHG laser light source and the second harmonics generator. The resonator length controller 230 may be provided separately for controlling the resonator length of the light resonator made up of the plane mirror 215 and the concave mirror 216. The illuminating light source of the off-axis alignment detection system may also be constructed by a laser source other than the projection optical light source. The laser diode 211 constituting the laser light source 210 may be employed as the illuminating light source for the off-axis alignment detection system. The light resonator 222 may be designed so that part of the light incident on the light detector 222 is radiated from the second concave mirror 224. It is also possible to separate the light having the long wavelength component from the light radiated by the light resonator 222 using a band-pass filter and to employ the light having such long wavelength component as an illuminating light source for the off-axis alignment detection system.

The construction of the light resonator 222 of the second harmonics generator 220 may be designed as a Fabry-Perot resonator made up of the concave mirror and the plane mirror. In such case, it suffices to place a reflective mirror transmitting the light incident on the second harmonics generator 220 and reflecting the return light from the second harmonics generator 220 ahead of the second harmonics generator 220 and to detect the light reflected by the reflective mirror by the photodetector 231. For changing the resonator length of the light resonator 222, it is possible to move other mirrors than the first concave mirror 223.

The resonator length controller 230 may also be constructed as a resonator length controller formed of PZT. That is, for moving the first concave mirror 223 constituting the light resonator 222, a resonator length controller comprised of a controller supplying a signal proportional to changes in the length L of the resonator and the stacked piezoelectric elements, such as PZT, to the stacked piezoelectric elements, is employed, and a servo loop is designed for feeding back such signal. The resonator length of the light resonator 222 may be controlled in this manner to control the intensity of the light radiated from the second harmonics generator 220.

The light radiated from the second harmonics generator 220 is a light having the wavelength corresponding to the second harmonics of the incident light from the laser light source. The light radiated from the second harmonics generator 220 may be fifth harmonics instead of the fourth harmonics referenced to the light radiated by the solid laser medium. In such case, the light radiated from the solid laser medium formed of, for example, Nd:YAG, having the wavelength of 1064 nm, and the light radiated from the second harmonics generator 220, are combined, and the combined light is again transmitted through another second harmonics generator 220, such as one employing an organic crystal urea $CO(NH_2)_2$ as the non-linear optical crystal element, for generating the fifth harmonics of the solid laser medium made up of Nd:YAG (wavelength, 213 nm).

The substrate may be exemplified by a silicon semiconductor substrate, a compound semiconductor substrate, such as GaAs or a glass substrate for forming TFT.

It is possible to correct the focal point of the projection optical system 262 using the light source of the off-axis alignment detection system in the semiconductor exposure device of the present invention. In the conventional resist exposure system, the reference focal point value in the projection optical system is pre-set and the optimum focal point in the actual resist exposure process for the substrate or the resist material in use is determined as an offset from the reference focal point. In other words, once the substrate in use and the resist material are selected, the distance (offset) between the reference focal point and the optimum focal point in the actual resist exposure process becomes substantially constant, and the optimum focal point position is determined with the offset taken into account. Consequently, should the reference focal point be fluctuated, the focal point during the actual resist exposure process is deviated from the optimum focal point. Thus it becomes necessary to check whether or not the reference focal point value is fluctuated at a pre-set interval.

To this end, a photochromic material is previously arranged on the substrate stage. As such photochromic material, a variety of organic or inorganic photochromic materials may be employed. The organic photochromic materials may be exemplified by those according to reaction configurations such as cleavage of bonding (spiropyran), photoredox (methylene blue $+Fe^{2+}$), generation of free radicals by optical dissociation (β tetrachloro-1-ketodihydro naphthalene), tautomerism by hydrogen migration in molecule (salicylidene aniline), cis-trans photoisomerization (azobenzene) or photopolymerization (anthracene). As the inorganic photochromic materials, those obtained by doping oxides, such as $SrTiO_3$, with transition metal elements, by doping fluorides, such as $CaF_2$ with rare earth elements or by dispersing silver halides in glass, such as silicate glass, may be employed.

What is claimed is:
1. A semiconductor exposure device comprising
light beam generating means for illuminating a reticle having a semiconductor circuit pattern formed thereon, said light beam generating means including a light source for excitation, a first resonator and a second resonator, said first resonator being illuminated with a light beam from said light source for excitation and wavelength-converting and outputting the light beam from said light source for excitation, said second resonator being illuminated with the light beam from said first resonator and wavelength-converting and outputting the light beam from said first resonator, an image-forming optical system for forming on a wafer a light image produced on illuminating said reticle with the light beam from said light beam generating means, movement means for moving said wafer relative to said image-forming optical system, and alignment means for detecting the position of the image formed on said wafer by said image-forming optical system with respect to said wafer for position matching the image formed by said image-forming optical system with respect to the wafer.

2. The semiconductor exposure device as claimed in claim 1 wherein said alignment means comprises a detection optical system for radiating a beam at an offset position from the optical axis of a light beam radiated on said wafer from the light source means by said image-forming optical system for detecting the position of the image formed on said wafer by said image-forming optical system with respect to the wafer.

3. The semiconductor exposure device as claimed in claim 2 wherein said alignment means comprises a first photodetector for detecting a 0th order diffracted light of the return light from the wafer of the light beam outputted by said first resonator of said light beam generating means, and a second photodetector for detecting the first order diffracted light of the return light from the wafer of the light beam radiated by said first resonator, and wherein the alignment means calculates the positional deviation relative to the wafer of the image formed on said wafer by said image-forming optical system based on detection signals of said first and second photodetectors and supplying the results of calculation to said movement means.

4. The semiconductor exposure device as claimed in claim 1 wherein said first resonator comprises a laser medium illuminated by a light beam radiated from said excitation light source and a first non-linear optical crystal device illuminated by a light beam from said laser medium and wherein said second resonator comprises a second non-linear optical crystal device illuminated by a light beam radiated by said first resonator, a pair of reflective surfaces on either sides of said second non-linear optical crystal device, and control means for causing one of said reflective surfaces along the optical axis of the light beam radiated by said second resonator for controlling the resonator length of said second resonator.

5. The semiconductor exposure device as claimed in claim 1 further comprising a combining optical system for combining light beams from a plurality of said light beam generating means and radiating a combined light beam on said reticle.

6. A semiconductor exposure device comprising light beam generating means for illuminating a reticle having a semiconductor circuit pattern formed thereon, said light beam generating means including a light source for excitation, a first resonator and a second resonator, said first resonator being illuminated with a light beam from said light source for excitation and wavelength-converting the light beam from said light source for excitation for outputting a first light beam, said second resonator being illuminated with the first light beam from said first resonator and wavelength-converting the first light beam for outputting a second light beam, an image-forming optical system for radiating said second light beam from said light beam generating means on said reticle for generating an illuminated light image on said wafer, movement means for moving said wafer relative to said image-forming optical system, and alignment means for detecting the position relative to said wafer of the image formed on said wafer by said image-forming optical system on the basis of a return beam from the wafer of said first light beam for position matching the image formed by said image-forming optical system with respect to the wafer.

7. The semiconductor exposure device as claimed in claim 6 wherein said first light beam is radiated at a position on said wafer offset from the optical axis of said second light beam.

8. The semiconductor exposure device as claimed in claim 7 wherein said alignment means comprises a first photodetector for detecting a 0th order diffracted light of the return light from the wafer of said first light beam and a second photodetector for detecting the first order diffracted light of the return light from the wafer of the first light beam, and wherein the alignment means calculates the positional deviation relative to the wafer of the image formed on said wafer by said image-forming optical system based on detection signals of said first and second photodetectors and transmits the results of calculation to said movement means.

9. The semiconductor exposure device as claimed in claim 7 wherein said light beam generating means comprises an optical splitting device interposed between said first and said second resonators for separating a portion of the first light beam from said first resonator.

10. The semiconductor exposure device as claimed in claim 7 further comprising a detection light source for detecting the position relative to the wafer of the image illuminated and formed on said wafer by said image-forming optical system along with the first light beam outputted by said first resonator.

11. The semiconductor exposure device as claimed in claim 10 wherein said detection light source is a He—Ne laser source.

12. The semiconductor exposure device as claimed in claim 6 wherein said light beam generating means comprises phase modulation means interposed between said first and second resonators for phase modulating the first light beam from said first resonator.

13. A semiconductor exposure device comprising light beam generating means for illuminating a reticle having a semiconductor circuit pattern formed thereon, said light beam generating means including a light source for excitation, a first resonator and a second resonator, said first resonator being illuminated with a light beam from said light source for excitation and wavelength-converting and outputting the light beam from said light source for excitation, said second resonator being illuminated with the light beam from said first resonator and wavelength-converting and outputting the light beam from said first resonator, an image-forming optical system for forming on a wafer an illuminated light image produced on illuminating said reticle with the light beam from said light beam generating means, movement means for moving said wafer relative to said image-forming optical system, and alignment means for radiating a light beam offset from the optical axis of the light beam illuminated from the light beam generating means by said image-forming means on the wafer for detecting the position relative to the wafer of the image formed on said wafer by said image-forming optical system for position matching the image formed by said image-forming optical system with respect to the wafer.

14. The semiconductor exposure device as claimed in claim 13 wherein said alignment means comprises a first photodetector for detecting a 0th order diffracted light of the return light from the wafer of the light beam outputted by said first resonator of said light beam generating means, and a second photodetector for detecting the first order diffracted light of the return light from the wafer of the light beam radiated by said first resonator, and wherein the alignment means calculates the positional deviation relative to the wafer of the image formed on said wafer by said image-forming optical system based on detection signals of said first and second photodetectors and transmits the results of calculation to said movement means.

15. The semiconductor exposure device as claimed in claim 13 wherein said first resonator comprises a laser medium illuminated by a light beam radiated from said excitation light source and a first non-linear optical crystal device illuminated by a light beam from said laser medium and wherein said second resonator comprises a second non-linear optical crystal device illuminated by a light beam radiated by said first resonator, a pair of reflective surfaces on either sides of said second non-linear optical crystal device, and control means for causing one of said reflective surfaces to be moved along the optical axis of the light beam radiated by said second resonator for controlling the resonator length of said second resonator.

16. A semiconductor exposure device comprising light beam generating means for illuminating a reticle having a semiconductor circuit pattern formed thereon, said light beam generating means including a light source for excitation for radiating a light beam having a wavelength of 810 nm, a first resonator and a second resonator, said first resonator including a laser medium illuminated by a light beam of a wavelength of 810 nm from said light source for excitation and a first non-linear optical crystal device illuminated by the light beam of a wavelength of 1064 nm from said light medium for excitation for outputting a light beam of a wavelength of 532 nm, said second resonator including a second non-linear optical crystal element illuminated by the light beam of a wavelength of 532 nm from said first resonator for outputting a light beam of a wavelength of 266 nm, an image-forming optical system for radiating said light beam of the wavelength of 266 nm from said light beam generating means on said reticle for generating a light image on said wafer, movement means for moving said wafer relative to said image-forming optical system, and alignment means for detecting the position relative to said wafer of the image formed on said wafer by said image-forming optical system for position matching the image formed by said image-forming optical system with respect to the wafer.

17. The semiconductor exposure device as claimed in claim 16 further comprising an integrator arranged between said light beam generating means and said reticle.

18. The semiconductor exposure device as claimed in claim 16 wherein said second resonator further comprises a pair of reflecting surfaces arranged on either sides of said second non-linear optical crystal device, and control means for causing one of the reflecting surfaces to be moved along the optical axis of the light beam of the wavelength of 266 nm for controlling the resonator length of said second resonator.

19. The semiconductor exposure device as claimed in claim 18 wherein the reflecting surface on the output side of said second resonator outputs the light beam with the wavelength of 532 nm from said first resonator and the light beam with the wavelength of 266 nm from said second resonator.

20. The semiconductor exposure device as claimed in claim 16 wherein said alignment means comprises a detection optical system for radiating a beam at an offset position from the optical axis of the light beam with the wavelength of 266 nm from the light source means by said image-forming optical system for detecting the position of the image formed on said wafer by said image-forming optical system with respect to the wafer.

21. The semiconductor exposure device as claimed in claim 20 wherein said alignment means comprises a first photodetector for detecting a 0th order diffracted light of the return light from the wafer of the light beam of the wavelength of 532 nm outputted by said first resonator of said light beam generating means, and a second photodetector for detecting the first order diffracted light of the return light from the wafer of the light beam with the wavelength of 532 nm, and wherein the alignment means calculates the positional deviation relative to the wafer of the image formed on said wafer by said image-forming optical system based on detection signals of said first and second photodetectors and transmits the results of calculation to said movement means.

22. The semiconductor exposure device as claimed in claim 16 wherein said light beam generating means comprises an optical device interposed between said first and said second resonators for separating a portion of the light beam with the wavelength of 532 nm from said first resonator.

23. The semiconductor exposure device as claimed in claim 16 further comprising a detection light source for detecting the position relative to the wafer of the image formed on said wafer by said image-forming optical system, said image being radiated on said wafer along with the light beam with the wavelength of 532 nm outputted by said first resonator.

24. The semiconductor exposure device as claimed in claim 23 wherein said detection light source is a He—Ne laser source.

* * * * *